United States Patent
Cheng et al.

(10) Patent No.: US 9,716,158 B1
(45) Date of Patent: Jul. 25, 2017

(54) AIR GAP SPACER BETWEEN CONTACT AND GATE REGION

(71) Applicant: INTERNATIONAL BUSINESS MACHINES CORPORATION, Armonk, NY (US)

(72) Inventors: Kangguo Cheng, Schenectady, NY (US); Nicolas Jean Loubet, Guilderland, NY (US); Xin Miao, Guilderland, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/076,362

(22) Filed: Mar. 21, 2016

(51) Int. Cl.
*H01L 29/66* (2006.01)
*H01L 29/78* (2006.01)
(Continued)

(52) U.S. Cl.
CPC ........ *H01L 29/4991* (2013.01); *H01L 21/764* (2013.01); *H01L 21/7682* (2013.01); *H01L 21/823418* (2013.01); *H01L 21/823431* (2013.01); *H01L 21/823468* (2013.01); *H01L 21/823475* (2013.01); *H01L 23/535* (2013.01); *H01L 23/53257* (2013.01); *H01L 27/0886* (2013.01); *H01L 29/0649* (2013.01); *H01L 29/0847* (2013.01); *H01L 29/161* (2013.01); *H01L 29/165* (2013.01); *H01L 29/1608* (2013.01); *H01L 29/6653* (2013.01); *H01L 29/7848* (2013.01); *H01L 29/66795* (2013.01); *H01L 29/785* (2013.01)

(58) Field of Classification Search
CPC .............. H01L 21/7682; H01L 21/764; H01L 21/823468; H01L 21/823821; H01L 21/845; H01L 29/6653; H01L 29/785; H01L 29/66545; H01L 29/66795; H01L 29/0649; H01L 29/4991; H01L 27/10826; H01L 27/1211
See application file for complete search history.

(56) References Cited

U.S. PATENT DOCUMENTS 7,670,924 B2   3/2010   Demos et al.
7,850,863 B2   12/2010  Zenasni
(Continued)

FOREIGN PATENT DOCUMENTS

CN   104167359 A   11/2014
CN   102931064 B   4/2015

*Primary Examiner* — Marvin Payen
*Assistant Examiner* — Jeremy Joy
(74) *Attorney, Agent, or Firm* — Daniel P. Morris, Esq.; Otterstedt, Ellenbogen & Kammer, LLP

(57) ABSTRACT

Unfilled gaps are provided as spacers between gate stacks and electrically conductive source/drain contacts to reduce parasitic capacitance in CMOS structures. Sidewall spacers are removed partially or entirely from portions of the gate stacks and replaced by materials such as amorphous semiconductor materials. Source/drain contacts subsequently formed on source/drain regions adjoin the spacer replacement material. Selective removal of the spacer replacement material leaves unfilled gaps between the source/drain contacts and the gate stacks. The unfilled gaps are then sealed by a dielectric layer that leaves the gaps substantially unfilled.

19 Claims, 8 Drawing Sheets

(51) Int. Cl.
*H01L 21/764* (2006.01)
*H01L 29/49* (2006.01)
*H01L 21/8234* (2006.01)
*H01L 27/088* (2006.01)
*H01L 29/08* (2006.01)
*H01L 29/16* (2006.01)
*H01L 29/161* (2006.01)
*H01L 29/165* (2006.01)
*H01L 23/535* (2006.01)
*H01L 23/532* (2006.01)
*H01L 21/768* (2006.01)
*H01L 29/06* (2006.01)

(56) References Cited

U.S. PATENT DOCUMENTS

| | | | |
|---|---|---|---|
| 7,928,003 B2 | 4/2011 | Naik | |
| 7,960,290 B2 | 6/2011 | Yu et al. | |
| 8,390,079 B2* | 3/2013 | Horak | H01L 29/4983 |
| | | | 257/401 |
| 8,614,107 B2 | 12/2013 | Lavoie et al. | |
| 8,629,035 B2 | 1/2014 | Nakazawa | |
| 8,941,157 B2* | 1/2015 | Kim | H01L 21/7682 |
| | | | 257/288 |
| 9,362,355 B1* | 6/2016 | Cheng | H01L 29/66742 |
| 9,419,091 B1* | 8/2016 | Leobandung | H01L 29/786 |
| 2008/0254579 A1* | 10/2008 | Chi | H01L 29/665 |
| | | | 438/199 |
| 2012/0199886 A1* | 8/2012 | Horak | H01L 21/76897 |
| | | | 257/288 |
| 2013/0093019 A1* | 4/2013 | Ando | H01L 29/66803 |
| | | | 257/347 |
| 2013/0248950 A1* | 9/2013 | Kang | H01L 29/78 |
| | | | 257/288 |
| 2014/0054713 A1* | 2/2014 | Lee | H01L 27/088 |
| | | | 257/368 |
| 2015/0091089 A1* | 4/2015 | Niebojewski | H01L 29/0843 |
| | | | 257/347 |
| 2015/0243544 A1* | 8/2015 | Alptekin | H01L 21/7682 |
| | | | 438/586 |
| 2016/0020335 A1 | 1/2016 | Bentley et al. | |
| 2016/0163816 A1* | 6/2016 | Yu | H01L 29/6656 |
| | | | 438/283 |
| 2016/0181143 A1* | 6/2016 | Kwon | H01L 27/1052 |
| | | | 438/586 |

* cited by examiner

AIR GAP SPACER BETWEEN CONTACT AND GATE REGION

FIELD

The present disclosure relates generally to semiconductor devices and, more specifically, to forming an unfilled air gap adjoining the gate region of a field-effect transistor and devices obtained including such unfilled air gaps.

BACKGROUND

With shrinking dimensions of various integrated circuit components, transistors such as FETs have experienced dramatic improvements in both performance and power consumption. These improvements may be largely attributed to the reduction in dimensions of components used therein, which in general translate into reduced capacitance, resistance, and increased through-put current from the transistors. Planar transistors, such as metal oxide semiconductor field effect transistors (MOSFETs) are well suited for use in high-density integrated circuits. As the size of MOSFETs and other devices decreases, the dimensions of source/drain regions, channel regions, and gate electrodes of the devices, also decrease.

Some types of field effect transistors (FETs) have three-dimensional, non-planar configurations including fin-like structures extending above substrates. Such field effect transistors are referred to as FinFETs. The substrates may include semiconductor on insulator (SOI) substrates or bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other insulating layers thereof following photolithography. Active fin heights are set by SOI thickness when employing SOI substrates. In bulk FinFETs, active fin height is set by oxide thickness and etched fin height. The gates of FinFETs can be formed using a "gate-first" process wherein a gate stack and spacers are formed prior to selective epitaxial growth wherein source and drain regions are enlarged. A "gate-last" process may alternatively be employed wherein the source/drain regions are formed immediately following fin patterning.

The use of metal gates within metal-oxide-semiconductor (MOS) transistors has developed with respect to both planar and three dimensional devices such as FinFET devices. Gate structures including a high-k dielectric layer and one or more metal layers that function as gate electrodes have been implemented. Replacement gate techniques, which are sometimes called "gate last" techniques, involve forming a "dummy" or sacrificial gate structure. The sacrificial gate structure remains present during various other fabrication processes, such as the formation of source/drain regions and possible annealing steps. The sacrificial gate structure is then removed to define a gate cavity where the desired actual gate structure is formed. Currently employed middle-of-line (MOL) metallization schemes that include the use of metal fill materials such as tungsten (W) on titanium nitride (TiN) liners.

In some replacement gate processes, disposable gate level layers are deposited on a semiconductor substrate as blanket layers, i.e., as unpatterned contiguous layers. The disposable gate level layers can include, for example, a vertical stack of a disposable gate dielectric layer, a disposable gate material layer, and a disposable gate cap dielectric layer. The disposable gate dielectric layer can be, for example, a layer of silicon oxide, silicon nitride, or silicon oxynitride. The thickness of the disposable gate dielectric layer can be from 1 nm to 10 nm, although lesser and greater thicknesses can also be employed. The disposable gate material layer includes a material that can be subsequently removed selective to the dielectric material of a planarization dielectric layer to be subsequently formed. For example, the disposable gate material layer can include a semiconductor material such as a polycrystalline semiconductor material or an amorphous semiconductor material. The thickness of the disposable gate material layer can be from 30 nm to 300 nm, although lesser and greater thicknesses can also be employed. The disposable gate cap dielectric layer can include a dielectric material such as silicon oxide, silicon nitride, or silicon oxynitride. The thickness of the disposable gate cap dielectric layer can be from 3 nm to 30 nm, although lesser and greater thicknesses can also be employed. Any other disposable gate level layers can also be employed provided that the material(s) in the disposable gate level layers can be removed selective to a planarization dielectric layer to be subsequently formed.

The disposable gate level layers are lithographically patterned to form disposable gate structures. Specifically, a photoresist is applied over the topmost surface of the disposable gate level layers and is lithographically patterned by lithographic exposure and development. The pattern in the photoresist is transferred into the disposable gate level layers by an etch process, which can be an anisotropic etch such as a reactive ion etch (RIE). The remaining portions of the disposable gate level layers (after the pattern transfer) form the disposable gate structures.

Disposable gate stacks may include, for example, first disposable gate structures formed over a first body region in a first device region (for example, an nFET region) and second disposable gate structures formed over a second body region in a second device region (for example, a pFET region). The first disposable gate structures can be a stack of a first disposable gate dielectric and gate material portions and first disposable gate cap portions, and the second disposable gate structures can be a stack of a second disposable gate dielectric and second disposable gate material portions and a second disposable gate cap portion. The first and second disposable gate cap portions are remaining portions of the disposable gate cap dielectric layer, the disposable gate material portions are remaining portions of the disposable gate material layer, and the disposable gate dielectric portions are remaining portions of the disposable gate dielectric layer. Gate spacers can be formed on sidewalls of each of the disposable gate structures, for example, by deposition of a conformal dielectric material layer and an anisotropic etch.

Source/drain extension regions are formed after the disposable gate structures have been completed. For example, selected dopants can be implanted into portions of the first body region that are not covered by the first disposable gate structures to form source/drain extension regions. Similarly, other selected dopants can be implanted into portions of the second body region that are not covered by the second disposable gate structures. Ion implantations can be employed to form source regions and drain regions for some devices. For example, dopants can be implanted into portions of the body regions that are not covered by the disposable gate structures and spacers.

A planarization dielectric layer is deposited over the semiconductor substrate, the disposable gate structures, and the gate spacers. The planarization dielectric layer may include a dielectric material that can be planarized, for example, by chemical mechanical planarization (CMP). For example, the planarization dielectric layer can include a doped silicate glass, an undoped silicate glass (silicon oxide), and/or porous or non-porous organosilicate glass. The planarization dielectric layer is planarized above the topmost surfaces of the disposable gate structures.

The disposable gate structures are removed by at least one etch. The at least one etch can be a recess etch, which can be an isotropic etch or anisotropic etch. The removal of the disposable gate structures can be performed employing an etch chemistry that is selective to the gate spacers and to the dielectric materials of the planarization dielectric layer. Cavities are formed from the spacers remaining after the disposable gate structures are removed. The semiconductor surfaces above the channel regions of the substrate can be physically exposed at the bottoms of the gate cavities, though native oxide layers may be present. The gate cavities are laterally enclosed by the gate spacers that were formed on the sidewalls of the disposable structures.

Replacement gate structures are formed in the gate cavities. Replacement gate structures are formed by replacement of the disposable structures and overlie channel regions of field effect transistors. A gate dielectric and a gate electrode are formed within each of the gate cavities. A gate dielectric layer can be deposited on the bottom surface and sidewall surfaces of each gate cavity and over the planarization dielectric layer. The gate dielectric layer can be deposited as a contiguous gate dielectric layer that contiguously covers all top surfaces of the planarization dielectric layer and all inner sidewall surfaces of the gate spacers. The gate dielectric layer can be a high dielectric constant (high-k) material layer having a dielectric constant greater than 3.9. Gate dielectric layers can include a dielectric metal oxide, which is a high-k material containing a metal and oxygen. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), and atomic layer deposition.

The replacement gate structures can include gate electrodes having different compositions in different regions of the substrate. For example, a first work function material layer can be deposited on the gate dielectric layers in one region and a second work function material can be deposited on the gate dielectric layers in a second region. An electrically conductive material layer can be deposited on the work function material layers. The conductive material layer can include a conductive material deposited by physical vapor deposition, chemical vapor deposition, and/or electroplating. The conductive material layer can be an aluminum layer, a tungsten layer, an aluminum alloy layer, or a tungsten alloy layer. Tungsten can be deposited by chemical vapor deposition. Portions of the gate conductor layer, the work function material layers, and the gate dielectric layers are removed from the planarization dielectric layer by a planarization process. Replacement gate structures are thus formed, which include gate conductor layers, work function material layers, and gate dielectric layers.

Self-aligned contacts facilitate alignment during fabrication of integrated circuit devices having small dimensions. Such contacts have been formed by depositing metals such as aluminum and tungsten in trenches formed in dielectric materials while avoiding electrical contact with metal gate material. The recessing of gate fill metallization is followed by formation of a dielectric (e.g. nitride) cap. Self-aligned contacts are then formed while preventing gate to contact shorts.

The effect of parasitic capacitance between the gate and the epitaxial source/drain regions and, more importantly, between the metal contact and gate of FinFET devices becomes more problematic with the increasing density of device nodes. Low-k spacers have been employed for reducing such parasitic capacitance.

SUMMARY

Principles of the present disclosure provide techniques for forming unfilled, air gap spacers during CMOS fabrication processes.

In accordance with a first exemplary embodiment, a method is provided that includes obtaining a structure including a plurality of field-effect transistors, each field-effect transistor including a channel region, a gate stack adjoining the channel region, source/drain regions adjoining the channel region, and sidewall spacers lining first and second sidewalls of the gate stack. The structure further includes a dielectric layer overlying the gate stacks and trenches within the dielectric layer, the trenches exposing a plurality of the sidewall spacers and a plurality of the source/drain regions. The sidewall spacers are removed, at least in part, from at least one of the first and second sidewalls of a plurality of the gate stacks and replaced with dummy spacers. Electrically conductive source/drain contacts are formed on a plurality of the source/drain regions and between pairs of the dummy spacers. The method further includes removing the dummy spacers, thereby forming unfilled gaps between the source/drain contacts and the gate stacks.

An exemplary semiconductor structure includes a plurality of field-effect transistors, each field-effect transistor including a channel region, a gate stack adjoining the channel region, and source/drain regions adjoining the channel region. A dielectric layer overlies the gate stacks. A plurality of trenches extend within the dielectric layer. Electrically conductive source/drain contacts are within the trenches and on a plurality of the source/drain regions. The source/drain contacts and the gate stacks are separated by unfilled gaps, the unfilled gaps including sealed upper end portions.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed.

Substantial beneficial technical effects are provided. For example, one or more embodiments may provide one or more of the following advantages:

Reducing parasitic capacitance near the gate regions of FET devices;

New process steps complementary with CMOS fabrication techniques;

Techniques compatible with wrap-around contacts.

These and other features and advantages of the present invention will become apparent from the following detailed description of illustrative embodiments thereof, which is to be read in connection with the accompanying drawings.

BRIEF DESCRIPTION OF THE DRAWINGS

The following detailed description, given by way of example, will best be appreciated in conjunction with the accompanying drawings, in which.

DETAILED DESCRIPTION

Principles of the present disclosure will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1A:
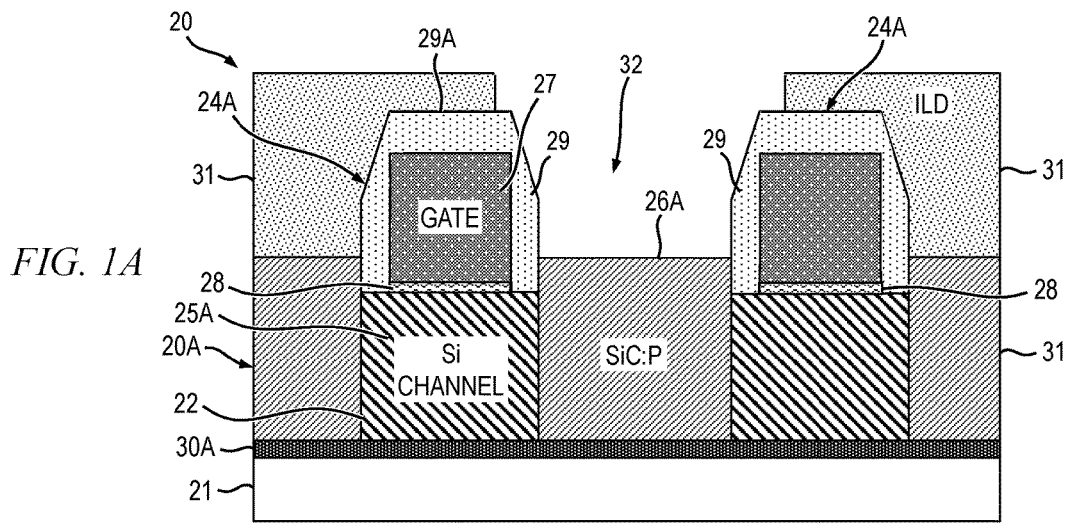
FIG. 1A is a schematic, cross-sectional view showing a portion of an nFET region of a structure including FinFET devices therein.
Figure 1B:
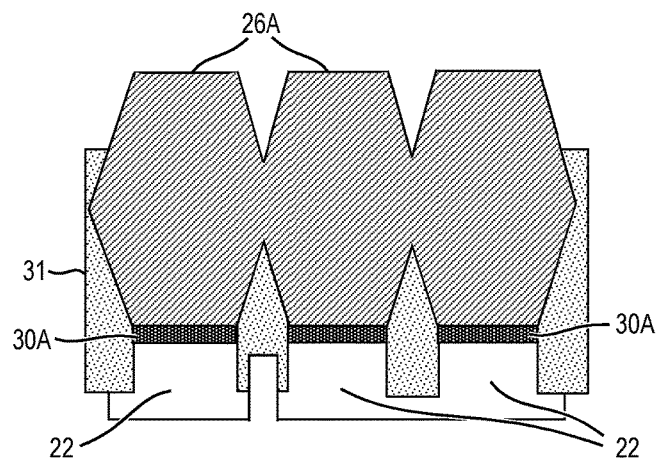
FIG. 1B is a schematic, cross-sectional view showing the portion of the nFET region taken across the fins of the structure.
Figure 1C:
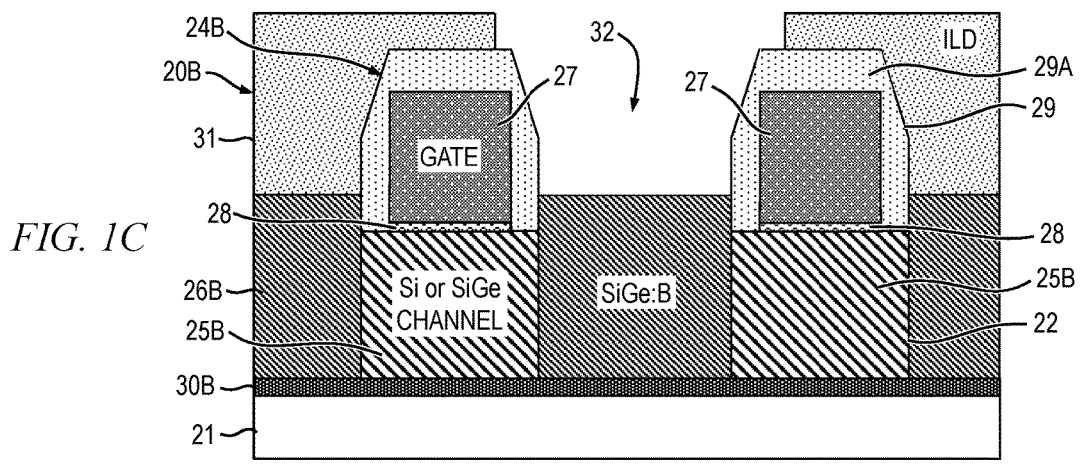
FIG. 1C is a schematic, cross-sectional view showing a portion of a pFET region of the structure including FinFET devices therein.

FIGS. 1 and 1B schematically illustrate a portion of an nFET region 20A of a semiconductor structure 20. The structure 20 includes parallel fins 22 and FinFET devices 24A including channel regions 25A comprising portions of the fins 22, n-type source/drain regions 26A operatively associated with the channel regions 25A, and gate stacks including gate electrodes 27 and gate dielectric layers 28. A dielectric spacer 29 covers the gate stack. Exemplary spacer materials include silicon nitride, SiBCN and SiOCN. The exemplary structure 20 is formed using a bulk silicon substrate 21, though the fabrication techniques described below can be applied to FinFET devices formed using semiconductor-on-insulator substrates. The gate stacks can be formed using replacement gate technology substantially as described above, it being appreciated that other techniques may also be suitable as well as techniques that may be developed in the future. The semiconductor structure 20 includes electrically isolated nFET 20A and pFET regions, a portion of a pFET region 20B being schematically illustrated in FIG. 1C. While shown as a structure including a substrate having semiconductor fins 22 as used in the fabrication of FinFET devices, the techniques described herein are also applicable to planar FET structures. The nFET region(s) of the exemplary structure 20 are used for forming nFET devices 24A and the pFET regions are for forming pFET devices 24B. A p-type punch through stop (PTS) layer 30A is provided in the nFET region(s) and an n-type PTS layer 30B is provided in the pFET region(s) of the structure 20. The formation of PTS layers for FinFET devices formed using bulk silicon substrates is known to the art. The channel regions 25A of the nFET devices are silicon in some embodiments. Silicon or silicon germanium channel regions 25B may be employed in the pFET devices.

In one exemplary process for fabricating FinFET devices on finned semiconductor substrates, dielectric and polysilicon layers are deposited on a finned substrate and patterned to form a dummy gate (not shown) in accordance with standard polysilicon gate CMOS process flows. Gate sidewall structures or spacers 29 are formed on the dummy gate. A silicon nitride ($Si_3N_4$) layer can be deposited via CVD, PECVD, sputtering, or other suitable technique, forming the spacers 29. The spacers can include a single layer or multiple layers made from a plurality of spacer materials. Spacer thickness is between four and fifteen nanometers (4-15 nm) in some embodiments. Spacers can be formed by any method known in the art, including depositing a conformal nitride layer over the dummy gate structures and removing unwanted material using an anisotropic etching process such as reactive ion etching or plasma etching. SiBCN spacers, if employed, can be formed using CVD at about 550° C. The dummy gate structures (not shown) and associated spacers 29 protect the underlying portions of the semiconductor fins 22 that later function as channel regions 25A, 25B of FinFET devices. Fin regions outside the dummy gate structures and spacers 29 later function as source/drain regions. Expanded source/drain structures 26A, 26B can be grown epitaxially on the exposed source/drain portions of the semiconductor fins 22. Either p-type devices or n-type devices can be fabricated depending on the conductivity types of the epitaxial source/drain structures, as known in the art. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. FIG. 1C schematically illustrates boron-doped silicon germanium regions that function as the source/drain regions 26B in the pFET region 20B of the structure 20. As used herein, "n-type" refers to the addition of impurities that contributes free electrons to an intrinsic semiconductor. In a silicon-containing substrate, examples of n-type dopants, i.e., impurities, include but are not limited to antimony, arsenic and phosphorous. In embodiments where n-type FinFET devices are to be formed, in-situ n-doped silicon carbide may be used to form the epitaxial source/drain structures 26A. Phosphorus-doped silicon carbide source/drain regions 26A are shown in the exemplary structure 20. In-situ doping of the source/drain regions can be conducted using conventional precursor materials and techniques. Source/drain epitaxy to form p-doped source/drain regions may include the introduction of boron precursor gas such as diborane. The p-doped source/drain regions 26B consist essentially of boron-doped silicon germanium in one or more exemplary embodiments. Exemplary epitaxial growth processes that are suitable for use in forming the n-doped silicon carbide 26A and p-doped silicon germanium 26B epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition processes typically ranges from 550° C. to 900° C. If the replacement gate technique is employed in conjunction with the formation of planar devices, conventional implantation of the substrate may be employed to form source/drain regions. As schematically illustrated in FIG. 1B, the epitaxial growth of the n-type source/drain regions 26A form faceted structures that may merge with each other. (The p-type source/drain regions 26B may likewise form merged, faceted structures.) Once the source/drain regions have been formed and other possible processing steps completed, an electrically insulating layer 31 is deposited on the structure and about the dummy gate. This layer may comprise materials such as silicon dioxide and may be referred to as an interlayer dielectric (ILD). The dielectric layer 31 may be planarized to expose the polysilicon layer of the dummy gate in embodiments employing the "gate last" fabrication technique. The dummy gate can then be removed by reactive ion etching (ME) and/or wet chemical etching to form a recess bounded by the spacers 29. Trenches 32 for allowing the deposition of electrical contacts (not shown) are formed in the ILD layer 31, exposing source/drain regions in the nFET and pFET regions of the structure as well as portions of the spacers 29 adjoining the exposed source/drain regions and the gate stacks. Such trenches 32 can be formed using a directional etch process such as a reactive ion etch (RIE).

The recesses within the spacers 29 are filled in part with the gate dielectric layer 28. A high-k gate dielectric layer may be conformally deposited in the recesses following dummy gate removal. The thickness of the gate dielectric material can vary depending on the required device performance. Chemical vapor deposition or atomic layer deposition (ALD) can be employed for depositing a high-k dielectric material such as hafnium oxide. Other exemplary high-k dielectric materials include but are not limited to $ZrO_2$, $La_2O_3$, $Al_2O_3$, $TiO_2$, $SrTiO_3$, $LaAlO_3$, $Y_2O_3$, $HFO_xN_y$, $ZrO_xN_y$, $La_2O_xN_y$, $Al_2O_xN_y$, $TiO_xN_y$, $SrTiO_xN_y$, $LaAlO_xN_y$, and $Y_2O_xN_y$. The gate dielectric layer used in some devices may alternatively include a multi-layer of $SiO_2$, SiON, SiN, and a high-k dielectric material, including but not limited to hafnium oxide ($HfO_2$), aluminum oxide ($Al_2O_3$), lanthanum oxide ($La_2O_3$), zirconium oxide ($ZrO_2$), and their respective silicates. The thickness of the gate dielectric may be in the range of 1.0 nm-5.0 nm in some exemplary embodiments. Post-deposition annealing (PDA) is conducted in accordance with conventional processing procedures. An etch-back process is employed to remove the gate dielectric material from the upper portions of the recesses. Plasma etching is among the techniques known for etching high-k dielectric materials such as hafnium oxide. Selected portions of the gate dielectric material in the lower portions of the recesses can be protected by a mask (not shown) during the etch-back process. The etch-back of conformally deposited gate dielectric materials is known in the art.

A titanium nitride (TiN) liner/barrier film layer (not shown) may be conformally deposited on the gate dielectric layer 28 using, for example, an ALD process. The barrier film layer may have a thickness of about 40 Å of titanium nitride (TiN) in embodiments wherein tungsten metallization is later employed. Tantalum nitride (Ta(N)) may alternatively be employed to form the barrier film layer. The barrier film layer may comprise multiple layers in some embodiments, including a work function material adjoining the recess. In some embodiments, the barrier film layer is deposited subsequent to etch-back of the gate dielectric layer. Alternatively, the barrier film layer can be deposited prior to etch-back of the gate dielectric layer 28.

An organic planarization layer (OPL) (not shown) is deposited and then patterned to protect the barrier film layer in the lower portions of the recesses within the spacers 29. The work function metal (for example, titanium nitride) above the level of the OPL is etched away and removed. The remaining OPL is then removed from the structure by ashing. The resulting structure accordingly includes gate dielectric and barrier layers at the bottom portions of the recesses while the inner surfaces of the spacers 29 are exposed at the top portions of the recesses. In embodiments where the barrier film layer is deposited prior to etch-back of the gate dielectric layer, both layers are etched back at this stage.

Hydrogen-based processes may be employed to prepare/engineer an exposed metal surface such that subsequent metal deposition takes place selectively on exposed metal surfaces as opposed to non-metal surfaces such as the surfaces of dielectric materials. Nucleation selectively takes place on an exposed electrically conductive surface during the deposition of gate metal. Hydrogen-based surface treatment of the structure includes exposing the structure to hydrogen under certain pressure (0.5-10 torr), temperature (200-400° C.) and flow rate (1-12 standard liters per minute (slm)). The surface material (e.g. Ti(N), Ta(N)) lining the bottom portions of the recesses thereby become amenable to the deposition of electrically conductive metals that can function as gate electrodes while the nitride surfaces in the upper portions of the recesses and the oxide surface at the top of the structure are not so amenable.

Metal gate material is selectively deposited on the treated surface of the barrier layer. The gate metal layer can be from about three nanometers (3 nm) to five hundred nanometers (500 nm) in thickness in exemplary embodiments, though lesser and greater thicknesses may also be employed. Chemical vapor deposition (CVD) may be employed for the selective deposition of metals such as tungsten, cobalt, ruthenium, rhodium, osmium, iridium and/or molybdenum.

The gate electrode may be deposited as multiple layers in some embodiments. The employment of a process enabling selective deposition of gate metal enables the fabrication of the structure without the need for removing excess metal (metal overburden) on the structure via chemical mechanical planarization (CMP) and forming recesses within the spacers 29 via reactive ion etch (ME). Non-selective deposition of gate metal is conducted in some embodiments for obtaining the exemplary structure 20. Gate metal deposition may be timed so that the gate electrodes are confined to the lower portions of the recesses, leaving the upper portions of the recesses unfilled, or alternatively filling the entirety of each recess with gate metal.

Caps 29A are provided above the deposited gate metal 28 to protect the gate region during self-aligned contact etch. The caps 29A, like the spacer 29 lining the side walls of the gate metal, may be formed from materials such as silicon nitride to facilitate a self-aligned contact (SAC) process, ensuring requisite selectivity for the SAC etch. After deposition, the dielectric cap material is planarized. The dielectric caps 29A prevent shorting between the metal gates 28 and subsequently formed self-aligned contacts (not shown). As shown in FIGS. 1A and 1C, the gate stacks are entirely covered by a dielectric layer including the spacers 29 and caps 29A and comprising silicon nitride, SiBCN or other suitable material(s). It will be appreciated that various replacement gate techniques and materials may be employed to obtain the exemplary structure 20 schematically illustrated in FIGS. 1A-1C or similar structures including FinFET devices. Those of skill in the art are familiar with methods for fabricating structures having the elements contained within the exemplary structure 20 and similar structures, and new methods continue to be developed.

Figure 2A:
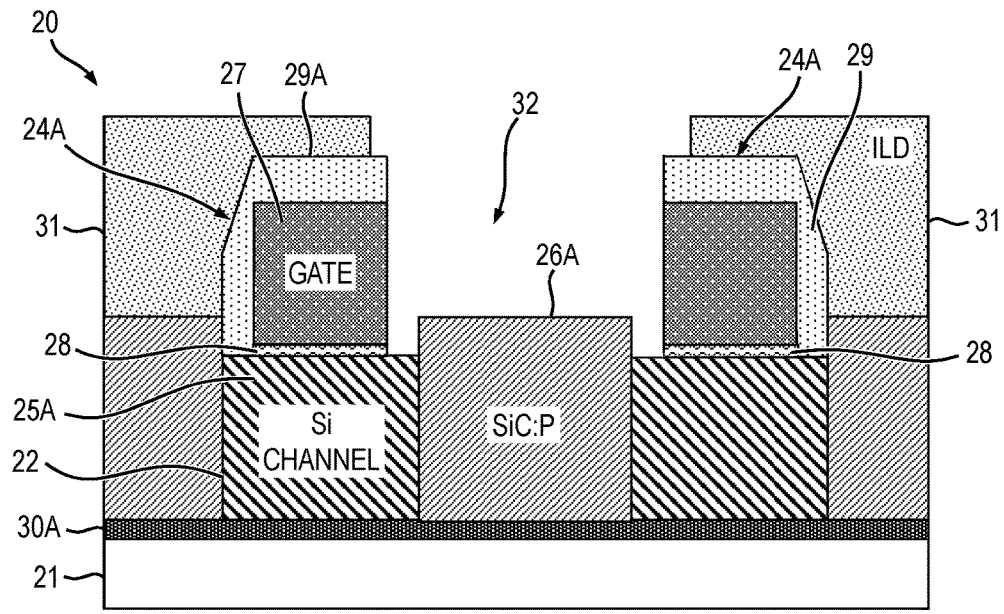
FIG. 2A is a schematic, cross-sectional view of a portion of the nFET region of the structure following removal of exposed portions of spacers adjoining gate regions.
Figure 2B:
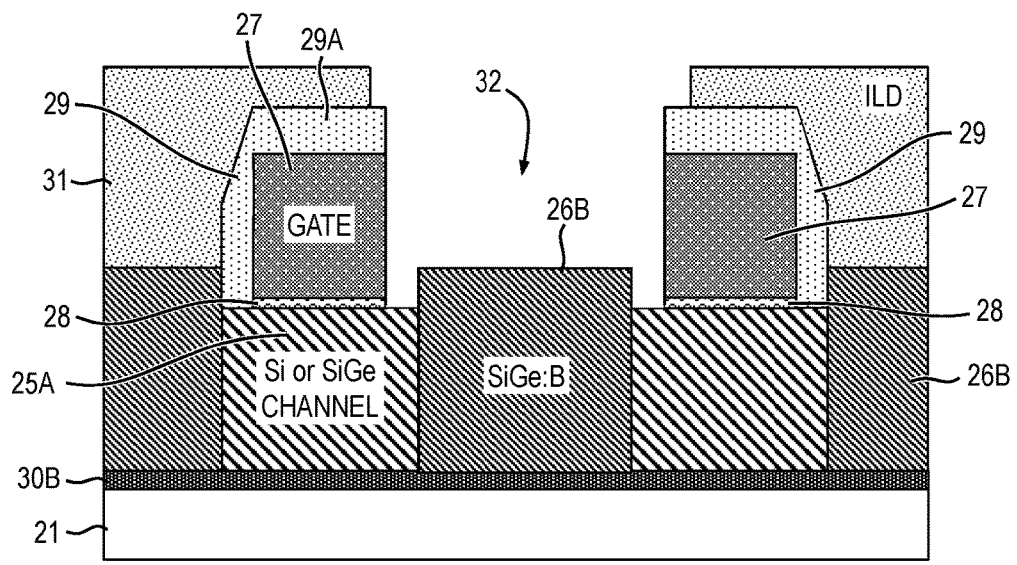
FIG. 2B is a schematic, cross-sectional view of a portion of the pFET region of the structure following removal of exposed portions of spacers adjoining gate regions.
Figure 3A:
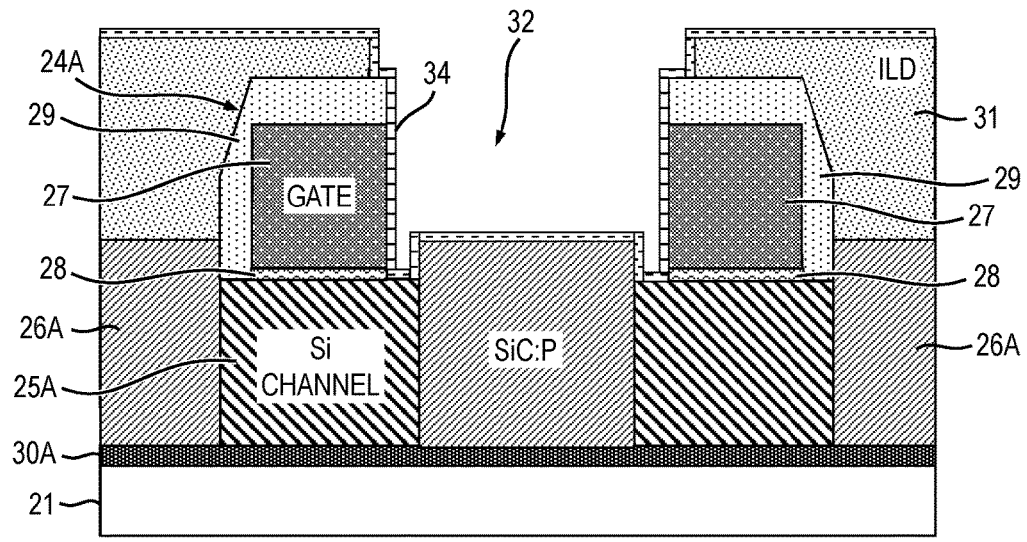
FIG. 3A is a schematic, cross-sectional view of a portion of the nFET region of the structure following deposition of a nitride layer.
Figure 3B:
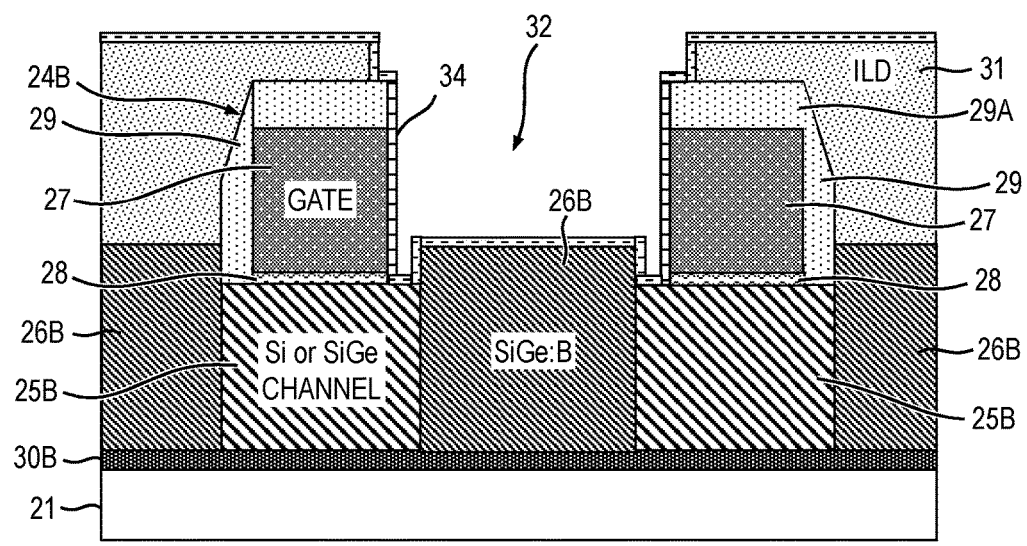
FIG. 3B is a schematic, cross-sectional view of a portion of the pFET region of the structure following deposition of a nitride layer.

Referring now to FIGS. 2A and 2B, the exposed portions of the spacers 29 exposed by the trenches 32 are removed using, for example, a selective etch process that leaves the ILD layer 31, the gate stacks, and the source/drain regions 26A, 26B substantially intact. In embodiments where the spacers 29 include multiple layers, at least the outer spacer layer (not shown) is removed while the inner spacer layer (not shown) may or may not be removed. In at least the embodiments where the exposed spacer portions are entirely removed, a thin layer 34 of dielectric material is deposited to obtain the structure shown in FIGS. 3A and 3B. The thin layer 34 is the same material as the material forming the spacer 29 and cap 29A in some embodiments, though use of the same material is not required. The deposited layer 34 is thinner than the portion of the spacer 29 which it replaces. For example, in an exemplary embodiment wherein the thickness of the spacer 29 is about ten nanometers, the deposited dielectric layer 34 is about two nanometers in thickness.

Figure 4A:
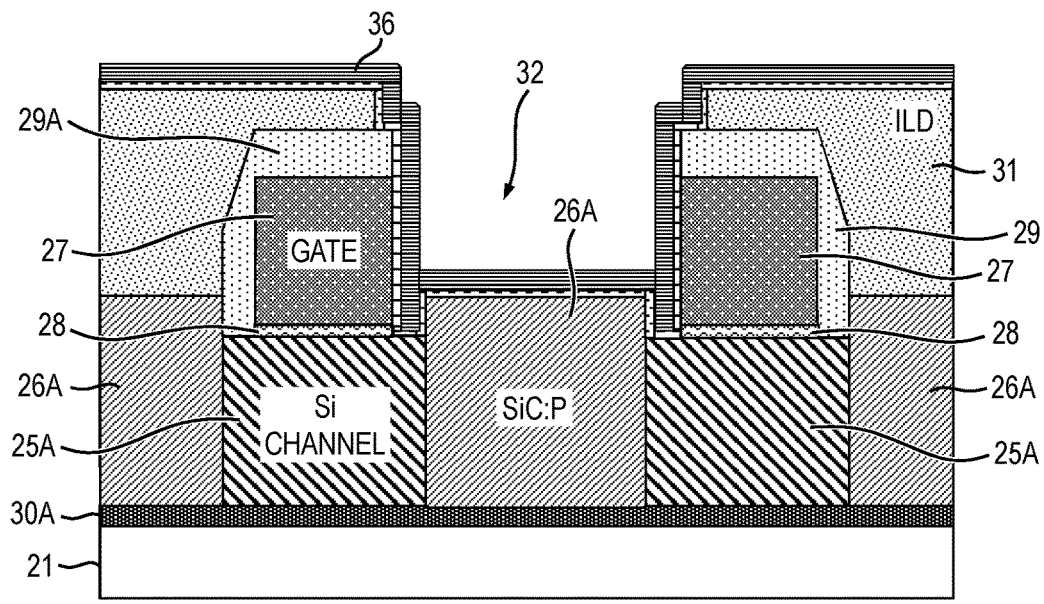
FIG. 4A is a schematic, cross-sectional view of a portion of the nFET region of the structure following deposition of an amorphous semiconductor layer.
Figure 4B:
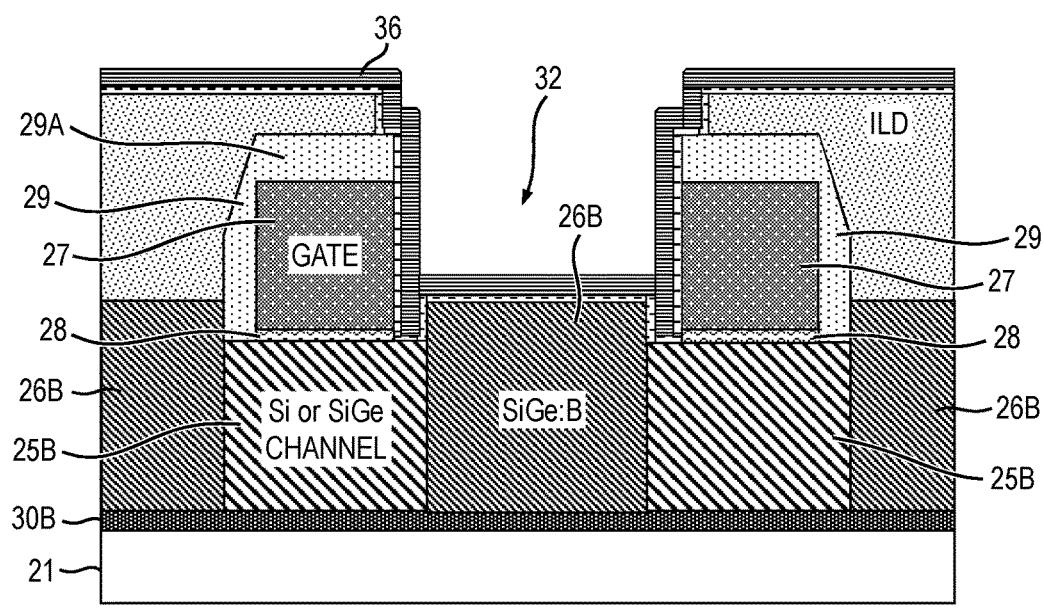
FIG. 4B is a schematic, cross-sectional view of a portion of the pFET region of the structure following deposition of the amorphous semiconductor layer.

A layer 36 that can be selectively etched with respect to source/drain contact material(s), for example tungsten, is deposited on the nFET and pFET regions of the structure. In an exemplary embodiment, amorphous germanium having a thickness between five and fifteen nanometers (5-15 nm) is deposited. Such deposition is non-selective. In some embodiments, the combined thicknesses of the thin dielectric layer 34 and the amorphous germanium layer are equal to the thickness of the spacer 29 of each original FinFET device. FIGS. 4A and 4B show portions of the nFET and pFET regions of a structure following deposition of the layer 36.

Figure 5A:
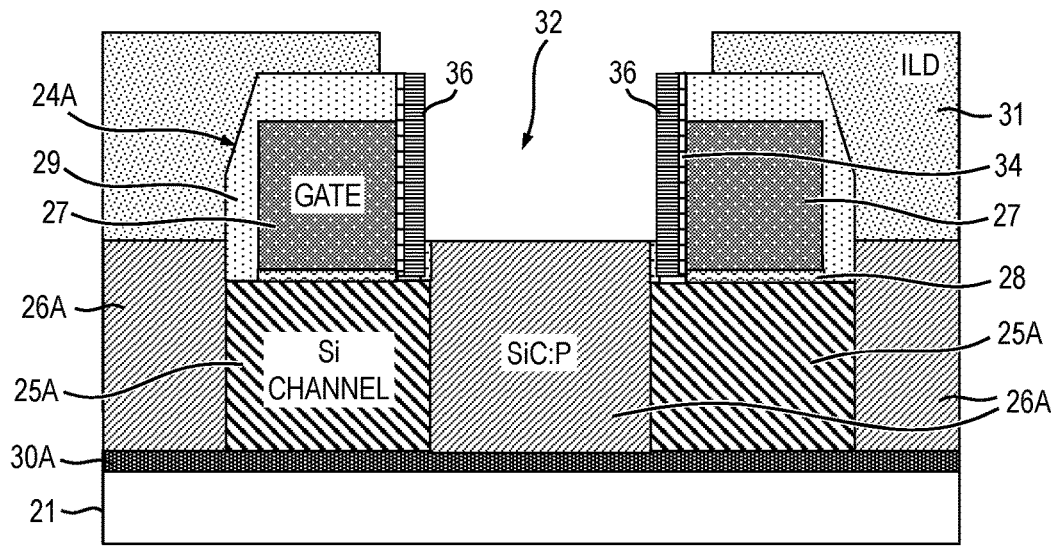
FIG. 5A is a schematic, cross-sectional view of a portion of the nFET region of the structure following etching of the amorphous semiconductor layer.
Figure 5B:
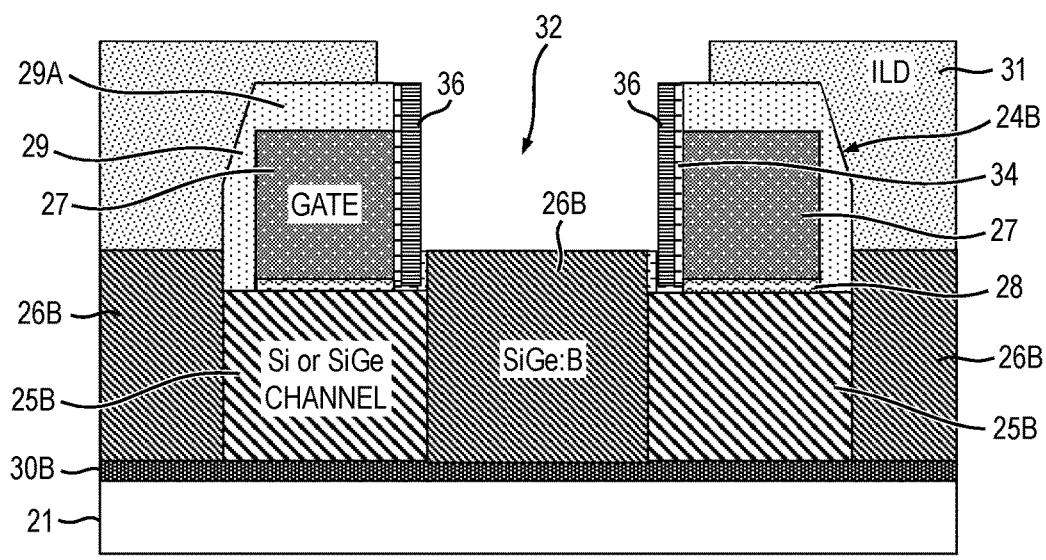
FIG. 5B is a schematic, cross-sectional view of a portion of the pFET region of the structure following etching of the amorphous semiconductor layer.

FIGS. 5A and 5B show the nFET and pFET regions 20A, 20B of the semiconductor structure following directional etching of the amorphous (e.g. germanium) layer 36. A reactive ion etch (ME) may be employed to remove the amorphous layer 36 from all surfaces other than the vertical portion thereof adjoining the thin dielectric (e.g. nitride) layer 34. The thicknesses of the vertical portions of the layer 36 bounding the trench 32 may remain substantially unchanged following removal of the other portions of the layer. The remaining vertical portions of the layer 36 form dummy sidewall spacers. The portions of the thin dielectric layer 34 deposited on the source/drain regions are also removed using RIE at this time.

In some embodiments, a silicide (silicon metal alloy) liner (not shown) is formed on the source/drain regions within the trenches 32 to reduce contact resistance. Electrically conductive source/drain contacts 38 such as metallic tungsten contacts are then deposited on the silicide layer. A nickel tungsten alloy may, for example, be deposited on the source/drain regions followed by annealing to cause the deposited metal layer to react with the semiconductor material comprising the source/drain regions. Nickel is highly diffusive and migrates relatively quickly into the semiconductor material, leaving a tungsten-rich surface portion within the liner. A tungsten-containing nucleation layer is deposited within the trenches 32 and on the silicide layer followed by filling the trenches 32 with metallic tungsten and chemical mechanical planarization (CMP). Specific methods of contact formation are described, for example, in U.S. Pat. No. 8,614,107, which is incorporated by reference herein. It will be appreciated that source/drain contact metal can alternatively be formed on a Ti/TiN liner, as known in the art. The processes discussed herein for providing the layer of contact metal such as metallic tungsten should be considered exemplary as opposed to limiting. Any suitable process for depositing contact metal(s) or other electrically conductive material suitable for functioning as source/drain contacts can be employed, whether presently known or those that may be developed in the future. It will be appreciated that wrap-around source/drain contacts may be formed in some embodiments of the present disclosure.

Figure 6A:
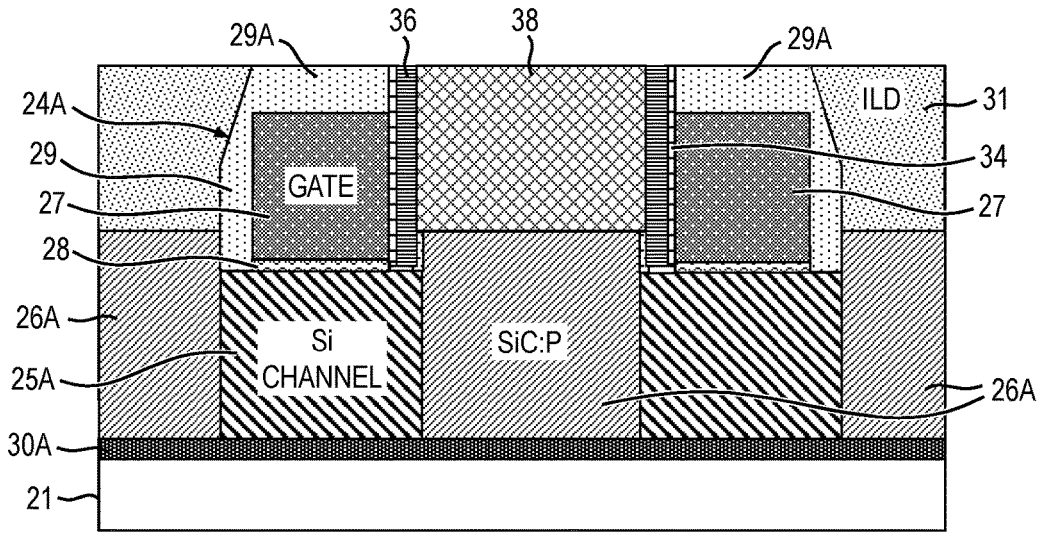
FIG. 6A is a schematic, cross-sectional view of a portion of the nFET region of the structure following deposition of a metal layer.
Figure 6B:
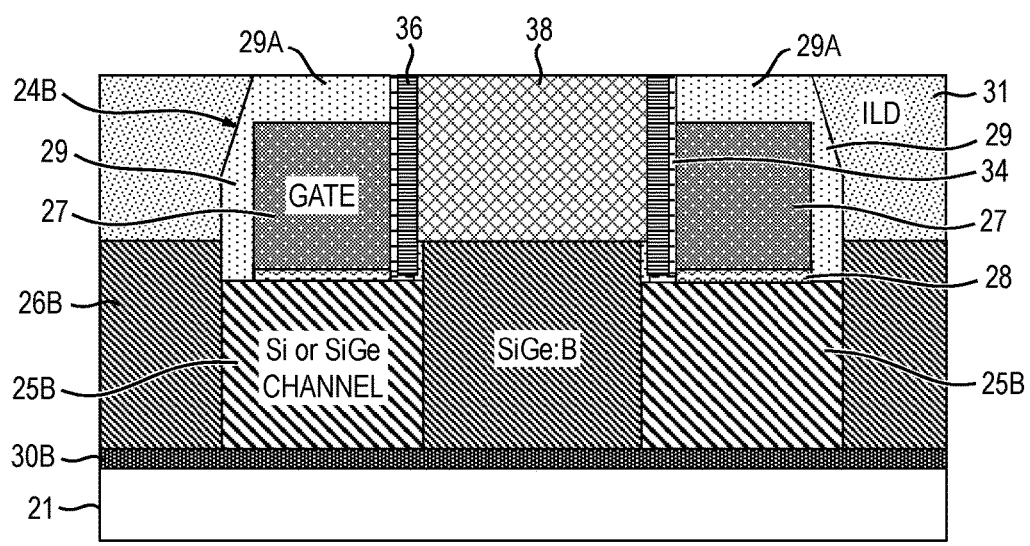
FIG. 6B is a schematic, cross-sectional view of a portion of the pFET region of the structure following deposition of a metal layer.
Figure 7A:
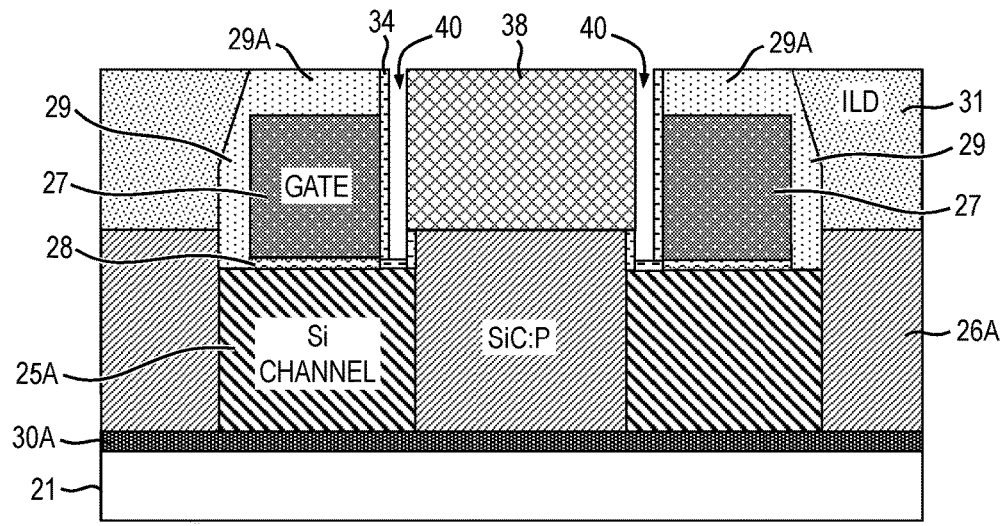
FIG. 7A is a schematic, cross-sectional view of a portion of the nFET region of the structure following removal of a remaining portion of the germanium layer.
Figure 7B:
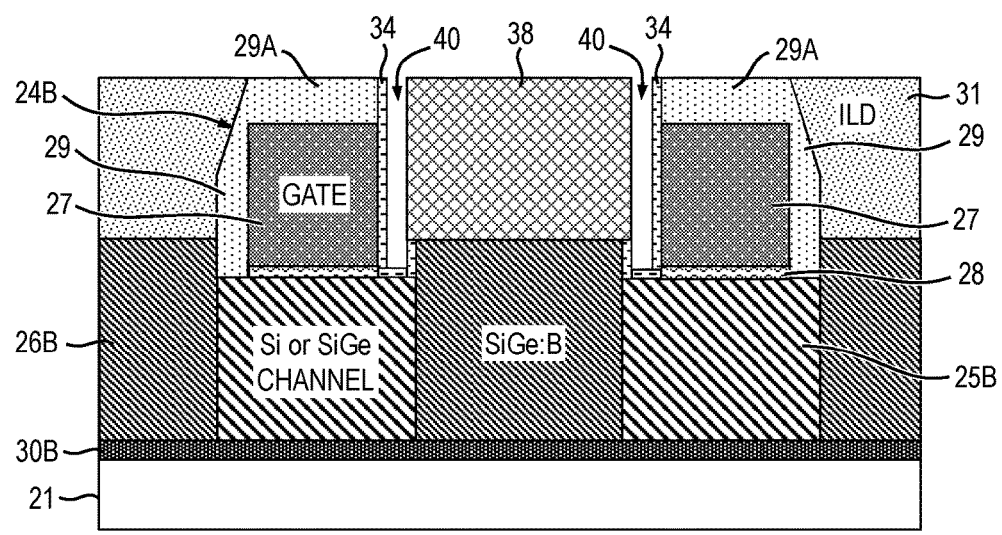
FIG. 7B is a schematic, cross-sectional view of a portion of the pFET region of the structure following removal of a remaining portion of the germanium layer.

Once a structure as schematically illustrated in FIGS. 6A and 6B has been obtained, the remaining portions of the amorphous layer 36 are selectively removed from the nFET and pFET regions thereof. Germanium is easily wet stripped and is therefore very suitable for use within the processes discussed herein. A structure as schematically illustrated in FIGS. 7A and 7B is thereby obtained. The structure includes gate stacks having one side protected by the sidewall spacer 29 and the opposite side protected by the thinner dielectric layer 34. Gaps 40 corresponding to the thicknesses of the stripped "dummy spacer" portions of the amorphous semiconductor layer 36 within the trenches 32 are accordingly provided on each side of the source/drain contacts 38, separating them from the adjoining gate stacks. In some embodiments, the unfilled gaps 40 between the dielectric layer 34 lining each gate stack and the source/drain contact 38 therebetween are between five and fifteen nanometers in width. The gaps 40 remain unfilled during subsequent processing steps to reduce parasitic capacitance between the gate stacks and the metal source/drain contacts 38 of the resulting structure. It will be appreciated that source/drain contacts and unfilled gaps are formed on both sides of the gate stacks in one or more embodiments, such features being omitted to simplify the drawings.

Figure 8A:
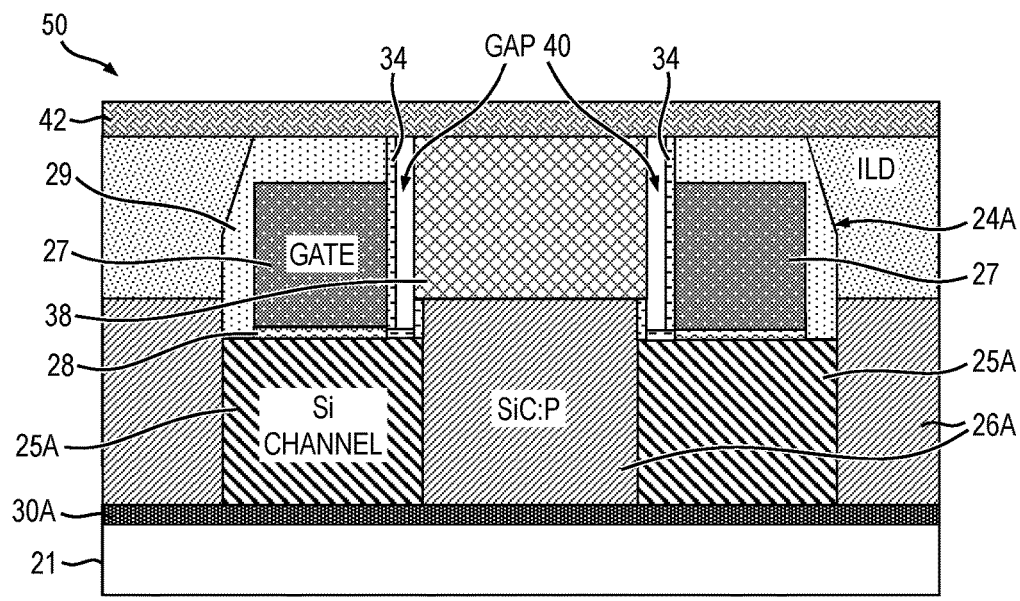
FIG. 8A is a schematic, cross-sectional view of a portion of the nFET region of the structure following deposition of a dielectric layer sealing the unfilled gaps between the gate regions and the source/drain contacts.
Figure 8B:
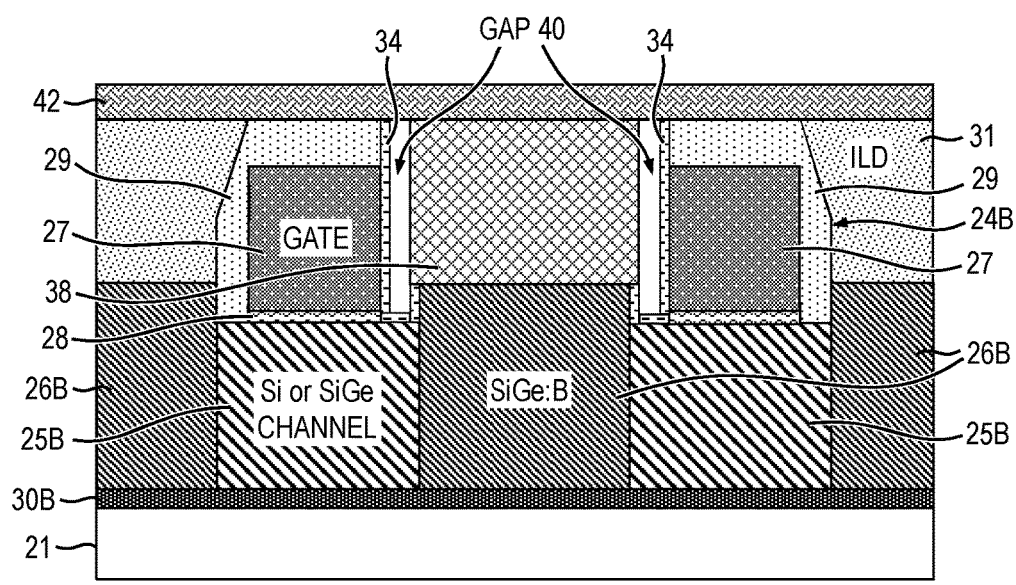
FIG. 8B is a schematic, cross-sectional view of a portion of the pFET region of the structure following deposition of the dielectric layer sealing the unfilled gaps between the gate regions and the source/drain contacts.

FIGS. 8A and 8B show the nFET and pFET regions of the structure following deposition of a dielectric layer 42 on the structure obtained following removal of the dummy spacers. The gaps 40 between the source/drain contacts 38 and the adjoining gate stacks remain substantially unfilled following deposition of the dielectric layer 42. A nitride (Si$_3$N$_4$) layer, for example, will fill only the uppermost portions of deep trenches that are five to fifteen nanometers in width, such as the gaps 40 provided in accordance with exemplary embodiments as described above. The dielectric layer accordingly pinches off the gaps 40 provided in the structure, thereby sealing the unfilled portions thereof. The gaps 40 remain sealed during subsequent processing.

Given the discussion thus far, an exemplary method includes obtaining a obtaining a structure 20 including a plurality of field-effect transistors 24A, 24B. Each field-effect transistor includes a channel region 25A, 25B, a gate stack 27, 28 adjoining the channel region, source/drain regions 26A, 26B adjoining the channel region, and sidewall spacers 29 lining first and second sidewalls of the gate stack. The structure further includes a dielectric layer 31 overlying the gate stacks and trenches 32 within the dielectric layer, the trenches exposing a plurality of the sidewall spacers and a plurality of the source/drain regions 26A, 26B. FIGS. 1A and 1B schematically illustrate nFET and pFET regions 20A, 20B of an exemplary structure 20. The sidewall spacers 29 are removed at least in part from at least one of the first and second sidewalls of a plurality of the gate stacks and replaced with dummy spacers 36, as schematically illustrated in FIGS. 5A and 5B. Electrically conductive source/drain contacts 38 are formed on a plurality of the source/drain regions and between pairs of the dummy spacers. The dummy spacers are removed, thereby forming unfilled gaps 40 between the source/drain contacts and the gate stacks, as schematically illustrated in FIGS. 7A and 7B. In some embodiments, replacing the sidewall spacers with dummy spacers further includes depositing a strippable layer 36, such as amorphous germanium layer, within the trenches and forming the dummy spacers from the strippable layer, as schematically illustrated in FIGS. 4A, 4B and 5A, 5B. The dummy spacers are later selectively removed while leaving the source/drain contacts 38 substantially intact. Forming the electrically conductive source/drain contacts may further include depositing contact metal within the trenches after the dummy spacers are formed, as schematically illustrated in FIGS. 6A and 6B. The exemplary method may further include forming a sealing layer 42 over the unfilled gaps, thereby sealing the unfilled gaps between the source/drain contacts and the gate stacks. As discussed above, a dielectric layer that will fill only the uppermost portions of the gaps 40, leaving the remainder unfilled, is employed in some embodiments. In accordance with one or more embodiments of the method, each trench 32 exposes opposing sidewall spacers 29 of two adjoining gate stacks. Removing the exposed sidewall spacers then further includes removing opposing pairs of the sidewall spacers from each pair of adjoining gate stacks, as shown in FIGS. 2A and 2B. In some embodiments, a thin, sidewall dielectric layer 34 is formed on the sidewalls of the gate stacks from which the dielectric layer has been removed. The dielectric layer 34 is thinner than the original sidewall spacer. In some embodiments, all or some of the field-effect transistors are fin type field-effect transistors (FinFETs), including pFET transistors and/or nFET transistors.

An exemplary semiconductor structure 50 includes a plurality of field-effect transistors 24A, 24B, each field-effect transistor including a channel region 25A, 25B, a gate stack adjoining the channel region, and source/drain regions 26A, 26B adjoining the channel region. A dielectric layer 31 overlies the gate stacks. The dielectric layer includes a plurality of trenches 32 that contain electrically conductive source/drain contacts 38 on a plurality of the source/drain regions. The source/drain contacts and the gate stacks are separated by unfilled gaps 40, the unfilled gaps including sealed upper end portions. FIGS. 8A and 8B schematically illustrate nFET and pFET regions of an exemplary structure 50. Each of the gate stacks 27, 28 may include a first sidewall, a sidewall spacer 29 on the first sidewall, a second sidewall, a sidewall dielectric layer 34 on the second sidewall, the sidewall spacer having a greater thickness than the sidewall dielectric layer. In accordance with one or more embodiments, the sidewall spacers 29 are removed from both sides of the gate stacks and replaced with thin sidewall dielectric layers. Each unfilled gap 40 adjoins one of the sidewall dielectric layers 34. Each of the source/drain contacts 38 may be positioned between a pair of the gate stacks and adjoins a pair of the unfilled gaps 40. Each of the unfilled gaps 40 may have a width between five and fifteen nanometers.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having FET devices formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A method comprising:
   obtaining a structure including:
      a plurality of field-effect transistors, each field-effect transistor including a channel region, a gate stack adjoining the channel region, source/drain regions adjoining the channel region, and sidewall spacers lining first and second sidewalls of the gate stack,
      a dielectric layer overlying the gate stacks, and
      trenches within the dielectric layer, the trenches exposing a plurality of the sidewall spacers and a plurality of the source/drain regions;
   removing the sidewall spacers at least in part from at least one of the first and second sidewalls of a plurality of the gate stacks;
   replacing the removed sidewall spacers with dummy spacers;
   forming electrically conductive source/drain contacts on a plurality of the source/drain regions and between pairs of the dummy spacers; and
   removing the dummy spacers, thereby forming unfilled gaps between the source/drain contacts and the gate stacks.

2. The method of claim 1, wherein replacing the sidewall spacers with dummy spacers further includes depositing a strippable layer within the trenches and forming the dummy spacers from the strippable layer, and forming the electrically conductive source/drain contacts further includes depositing contact metal within the trenches after the dummy spacers are formed.

3. The method of claim 2, further including depositing a sealing layer over the unfilled gaps, thereby sealing the unfilled gaps between the source/drain contacts and the gate stacks.

4. The method of claim 3, wherein the plurality of field-effect transistors include FinFETs and the source/drain regions include doped epitaxial regions.

5. The method of claim 4, wherein each trench exposes one of the sidewall spacers of two adjoining gate stacks, the dielectric layer covering another of the sidewall spacers of each two adjoining gate stacks, and further wherein removing the sidewall spacers further includes removing one of the sidewall spacers from the gate stack of each two adjoining gate stacks.

6. The method of claim 5, wherein the dummy spacers comprise amorphous semiconductor material.

7. The method of claim 1, wherein removing the sidewall spacers further includes removing the entireties of the sidewall spacers from at least one of the first and second sidewalls of a plurality of the gate stacks.

8. The method of claim 7, further including forming a second dielectric layer on the at least one of the first and second sidewalls of a plurality of the gate stacks following removing the sidewall spacers and forming the dummy spacers on the second dielectric layers.

9. The method of claim 8, wherein forming the dummy spacers includes depositing an amorphous semiconductor layer on the structure and subjecting the amorphous semiconductor layer to a directional etch.

10. The method of claim 8, further including depositing a sealing layer over the unfilled gaps, thereby sealing the unfilled gaps between the source/drain contacts and the gate stacks.

11. The method of claim 10, wherein forming the electrically conductive source/drain contacts further includes depositing contact metal within the trenches.

12. The method of claim 11, wherein the plurality of field-effect transistors include FinFETs and the source/drain regions include doped epitaxial regions.

13. A semiconductor structure comprising:
   a plurality of field-effect transistors, each field-effect transistor including a channel region, a gate stack adjoining the channel region, and source/drain regions adjoining the channel region;
   a dielectric layer overlying the gate stacks;
   a plurality of trenches within the dielectric layer;
   electrically conductive source/drain contacts within the trenches and on a plurality of the source/drain regions;

the source/drain contacts and the gate stacks being separated by unfilled gaps, the unfilled gaps including sealed upper end portions;

wherein each of the gate stacks includes a first sidewall, a sidewall spacer on the first sidewall, a second sidewall, a sidewall dielectric layer on the second sidewall, the sidewall spacer having a greater thickness than the sidewall dielectric layer, the unfilled gap adjoining the sidewall dielectric layer.

14. The semiconductor structure of claim 13, wherein the plurality of field-effect transistors include a plurality of FinFETs, the source/drain regions of the FinFETs including doped epitaxial regions.

15. The semiconductor structure of claim 14, wherein each of the source/drain contacts is positioned between a pair of the gate stacks and adjoins a pair of the unfilled gaps.

16. The semiconductor structure of claim 15, wherein each of the source/drain contacts includes a contact metal comprising tungsten.

17. The semiconductor structure of claim 15, wherein each of the unfilled gaps has a width between five and fifteen nanometers.

18. The semiconductor structure of claim 13, wherein each of the source/drain contacts is positioned between a pair of the gate stacks and adjoins a pair of the unfilled gaps.

19. The semiconductor structure of claim 18, wherein the sidewall dielectric layer included in each of the gate stacks has a thickness of about two nanometers.

* * * * *